United States Patent [19]

Kufner

[11] 3,924,325

[45] Dec. 9, 1975

[54] METHOD AND APPARATUS FOR MOUNTING TERMINAL PINS FROM A SINGLE SIDE OF A DOUBLE SIDED TERMINAL BOARD

[75] Inventor: Kenneth L. Kufner, Hickory Hills, Ill.

[73] Assignee: Molex Incorporated, Lisle, Ill.

[22] Filed: July 2, 1974

[21] Appl. No.: 485,116

[52] U.S. Cl. ................ 29/626; 29/203 B; 29/203 P

[51] Int. Cl.$^2$ .......................................... H05K 13/04

[58] Field of Search.......... 29/625, 626, 629, 630 B, 29/630 D, 203 R, 203 B, 203 J, 203 P, 203 S, 203 DT, 203 DS, 211 R, 208 R; 227/43, 114, 116, 119, 141, 142

[56] References Cited

UNITED STATES PATENTS

| | | | |
|---|---|---|---|
| 3,528,160 | 9/1970 | Wadleigh | 29/203 B |
| 3,713,197 | 1/1973 | Crump | 29/203 B |
| 3,765,075 | 10/1973 | Olney et al. | 29/203 B |
| 3,785,035 | 1/1974 | Busler et al. | 29/203 B |
| 3,835,521 | 9/1974 | Crump et al. | 29/203 B |

*Primary Examiner*—C. W. Lanham
*Assistant Examiner*—Joseph A. Walkowski
*Attorney, Agent, or Firm*—Louis A. Hecht

[57] ABSTRACT

Terminal pins extending from opposite sides of a circuit board are mounted in a single operation from a single working side of a circuit board. The terminal pins are aligned with holes in the circuit board by a vibratory loading method. Following alignment, the terminal pins are pressed into the holes to various depths by a stepped platen. The stepped platen has recesses formed in its working surface in areas where the terminal pins are to extend from the working side of the terminal board and no recesses in areas where the terminal pins are to extend from the opposite side of the terminal board.

14 Claims, 6 Drawing Figures

METHOD AND APPARATUS FOR MOUNTING TERMINAL PINS FROM A SINGLE SIDE OF A DOUBLE SIDED TERMINAL BOARD

The present invention relates to a method for mounting terminal pins extending from opposite sides of circuit members, and to apparatus useful in carrying out the method.

A known method of mounting terminal pins in circuit boards is to place a number of pins over a plate having holes aligned with circuit board holes and sized to align a single terminal pin with each circuit board hole. The plate assembly is vibrated, and one terminal pin seeks out each hole in the plate assembly and moves to a vertical position in alignment with a circuit board hole. The mounting of the pins is completed by forcing the pins into the circuit board holes. An improved system of this type for the mounting of elongated terminal pins is described in U.S. Pat. No. 3,812,569 issued to K. L. Kufner et al., assigned to the same assignee as the assignee of the present invention, and incorporated herein by reference.

Although this known method is satisfactory for inserting pins to a uniform depth into a circuit board, this method is not suitable for inserting terminal pins to extend from both sides of a circuit board. As a result, the mounting of terminal pins into both sides of the circuit board has been a problem in the past. The pins can be loaded by hand or by two separate insertion operations, but in either case the expense and time consumed are excessive.

Among the important objects of the present invention are to provide an improved method and apparatus for inserting terminal pins into circuit members; to overcome the disadvantages of prior art methods and apparatus; and to provide a method for the insertion of terminal pins to extend from both sides of a circuit board characterized by low cost, speed, and simplicity.

In accordance with the present invention, there is provided a plate assembly for aligning terminal pins with corresponding receiving holes in a circuit board. A number of terminal pins are placed on the surface of the plate assembly and the plate assembly is vibrated. During vibration, a single pin descends into each hole in a loading plate and is aligned with a corresponding hole in the circuit member. Subsequent to vibration, in accordance with an important feature of the invention, the terminal pins are forced through the loading plate to different depths by a stepped platen. The stepped platen has recesses formed in its working surface to allow the terminal pins under the recesses to extend upwardly from the circuit member while the other terminal pins are forced through the circuit member and extend outwardly from the opposite side of the circuit member.

The above and other objects and advantages of the present invention will appear from the following detailed description of the invention in connection with which reference is made to the accompanying drawings, wherein.

Having reference now to the drawings, the method and apparatus of the present invention are useful in the mounting of terminal pins 10 to varying depths so that they extend from opposite sides of circuit members such as a circuit board 12, a fragment of which is shown in FIGS. 2–5. The circuit board 12 comprises a conventional printed circuit board having a substrate formed of insulating material. For the purpose of establishing electrical connections to board circuitry, the board is provided with holes 14 at desired locations into which the terminal pins 10 are received with a force fit. In the illustrated arrangement, the board holes 14 are circular in cross section, and the pins are square in cross section. The diagonal of the pin cross section exceeds the diameter of the board holes 14 so that upon pressing of the pins into the board 14, a rigid friction fit is obtained. The pins 10 have a substantially uniform cross section over at least a portion of their length to permit the pins 10 to be inserted into the board 12 at different depths such that the major portion of some of the pins 10 extends from one side of the board while the major portion of the other ones of the pins 10 extends from the opposite side of the board so that a two sided terminal board assembly is obtained.

It should be understood that the principles of the present invention may be applied to terminal pins or conductors of many configurations including terminal pins having round or other cross sections, and including tapered pins that have a uniform cross section over at least a part of their length. Similarly, the principles of the invention may be used to mount terminal pins in a circuit member other than a printed circuit board, such as a housing, chassis, or the like.

Figure 1:
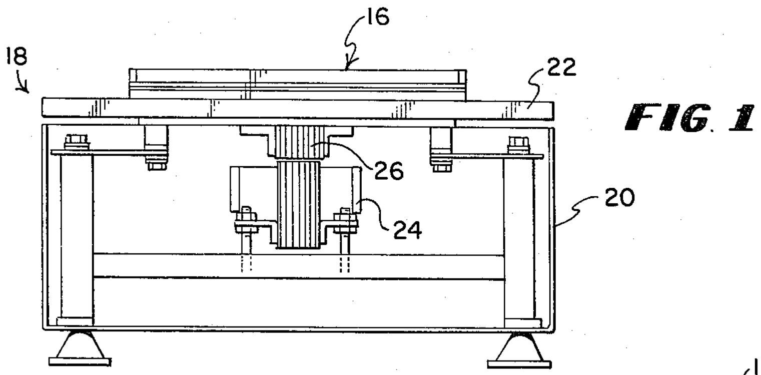
FIG. 1 is a diagrammatic elevational view of a terminal pin mounting apparatus constructed in accordance with the present invention and useful in carrying out the method of the present invention.

A plate assembly 16, similar to that described in the referenced U.S. Pat. No. 3,812,569, is vibrated by a vibrating device designated as 18. Referring to FIG. 1, the vibrating device 18 is illustrated in somewhat diagrammatic form, and may be conventional and similar to the device disclosed in U.S. Pat. No. 3,812,569. A typical device includes a housing 20 and a vibrating deck or table member 22. An electromagnetic assembly 24 is mounted within the housing, and an armature 26 is carried under the surface of the deck or table member 22. Upon excitation of the electromagnetic assembly 24 with an alternating current, the deck or table member vibrates in a vertical direction.

Figure 2:
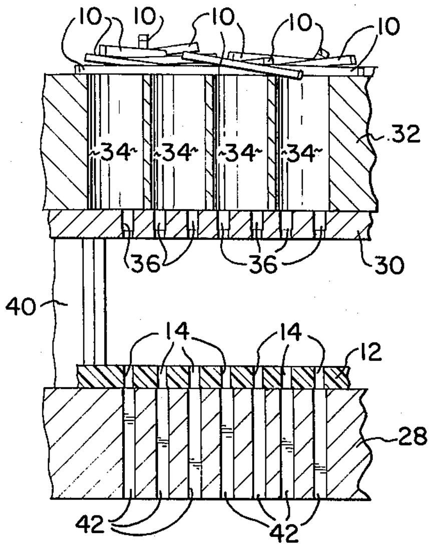
FIG. 2 is a sectional view of the plate assembly and circuit member showing a step in the method of the invention.
Figure 3:
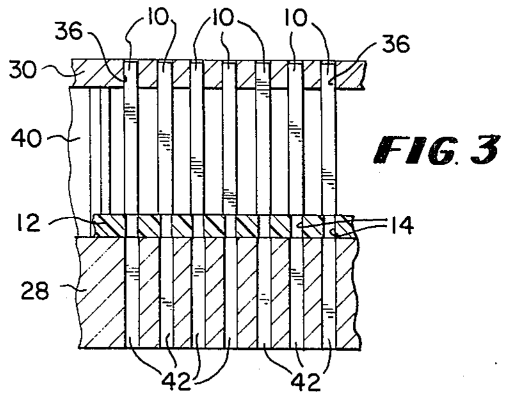
FIG. 3 is a view similar to FIG. 2 showing a subsequent step in the method of the invention.

The structure of the plate assembly 16 appears in more detail in FIGS. 2 and 3. The fragmentary portion of the plate assembly illustrated in FIGS. 2 and 3 serves to locate seven terminal pins 10 in alignment with seven holes 14 disposed in a straight line in the circuit board 12. Any number of holes 14 may be located in any desired pattern. Moreover, depending on the size of the board 12, more than one board may be contained within the plate assembly 16.

The plate assembly 16 includes a backing plate 28, and an apertured plate assembly including a loading plate 30 and a feeding plate 32. During the vibratory operation, pins placed on top of the feeding plate 32 enter the large holes 34 in the feeding plate 32 and subsequently one pin from one of the holes 34 enters each of the holes 36 in the plate 30.

Following the vibratory operation, one of the pins 10 has been inserted into each of the holes 36 of the loading plate 30. After the pins have been loaded into the holes 36, the feeding plate 32 is removed and the excess ones of the pins 10 are removed. As shown in FIG. 3, the remaining pins 10 are positioned for insertion into the holes 14 of the board 12.

In order to complete the mounting of the pins into the circuit board, each pin 10 is pressed downwardly through the loading plate 30 and into the holes 14 in the circuit board 12. In accordance with the present invention, this pressing operation is carried out by means of a stepped platen 38. Importantly, the stepped platen 38 makes it possible in a single, simple press operation to provide pins extending from opposite sides of the board member 12.

Figure 4:
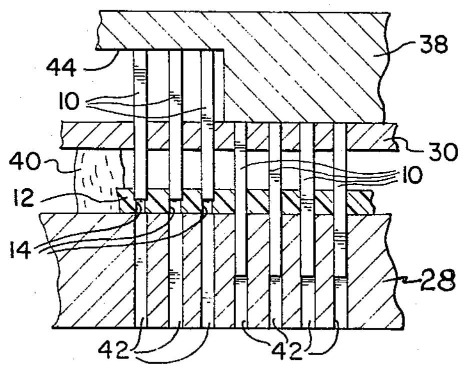
FIG. 4 is a view similar to FIG. 2 showing another step in the method of the invention.

FIG. 4 shows the pressing operating partially completed. During pressing, strippers 40 are compressed, and function to separate the plates 28 and 30 after completion of the pressing operation. The holes 42 in the backing plate 28 permit the terminal pins 10 to be pressed through the board 12 so that their lowermost portions are exposed on the opposite side of the board. This allows some of the pins 10 to be pressed almost completely through the board to provide a two sided terminal board structure.

Figure 5:
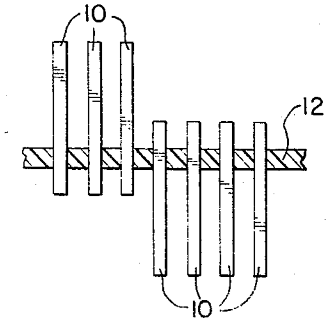
FIG. 5 is a view similar to FIG. 2 showing a circuit member having terminal pins mounted therein by the method of the present invention.

After the forcing of the terminal pins 10 into the board 12 is completed, the stepped platen 38 is withdrawn and the circuit board removed from the plate assembly 16. A portion of the completed board 12 including the terminal pins mounted by the apparatus of FIG. 4 is illustrated in FIG. 5.

The stepped platen 38, shown somewhat diagrammatically in FIG. 4, includes at least one recessed portion 44. During the pressing operation, the pins disposed below the recessed portion 44 are forced into the board only as far as necessary to provide a secure force fit. The remaining pins are forced almost completely through the board and extend upwardly from the board a distance limited only by the thickness of the loading plate 30.

Figure 6:
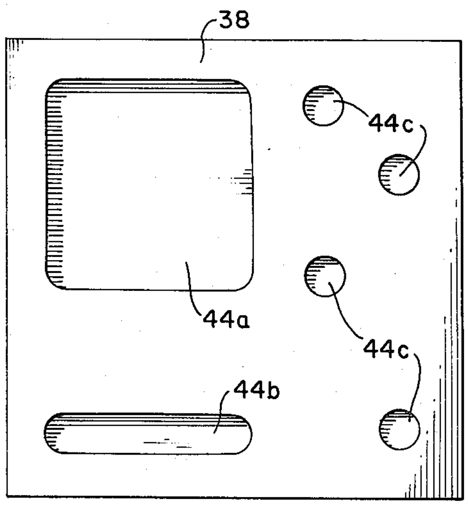
FIG. 6 is a bottom plan view of the working surface of a stepped platen constructed in accordance with the present invention for inserting terminal pins into a circuit member.

The configuration of the recesses in the working surface of the stepped platen 38 determines which ones of the terminal pins 10 will extend upwardly after the pressing operation. Various recess configurations are shown in FIG. 6. The recesses 44*a*, 44*b*, and 44*c* represent different possible configurations of the recessed portion 44 shown diagrammatically in FIG. 4. For example, if an array of upwardly extending pins is desired, a relatively rectangular recess, such as the recess 44*a*, may be disposed over the array. If a row of upwardly extending pins is desired, an elongated recess, such as the recess 44*b*, may be employed. For individual upwardly extending pins, circular recesses, such as the recesses 44c, may be used to encircle the individual pins. Other recess configurations are possible depending on the desired layout of the upwardly extending pins.

It should be appreciated that the method and apparatus of the present invention may be utilized to position and mount terminal pins of many sizes. In the arrangement illustrated in the drawings, the terminal pins 10 had a length of one inch and had a square cross section having sides of 0.045 inch. The loading plate 30 had a thickness of three-sixteenths inch and the circuit board had a thickness of one-sixteenth inch. The above dimensions result in the downwardly extending pins having an upwardly extending minor portion three-sixteenths inch and a downwardly extending major portion of threequarters inch. The length of the major portions of the upwardly extending pins is determined by the depth of the recesses 44. The depth may be adjusted to make the upwardly and downwardly extending portions of the pins equal, or may be tailored to provide insertion to various depths. The specific dimensions set forth above are given as examples and should not be taken to limit the present invention.

Although the present invention has been described with reference to details of the illustrated embodiment, it should be understood that various modifications and alterations will occur to those skilled in the art. The details of the illustrated structure should not be taken to limit the present invention which is defined in the following claims.

What is claimed and desired to be secured by Letters Patent of the United States is:

1. A terminal pin mounting method comprising the steps of aligning a plurality of terminal pins with holes in a major surface of a circuit member, and simultaneously forcing the terminal pins into said holes to various depths with a stepped platen so that the major portion of some of said terminal pins extends outwardly from said major surface and the major portion of other ones of said terminal pins extends outwardly from an opposing major surface of said circuit member.

2. The method of claim 1 wherein said aligning step includes the steps of positioning an apertured plate above said circuit member with the apertures thereof in alignment with said holes, placing a plurality of terminal pins over said apertured plate, and vibrating said apertured plate to position said pins in said apertures in alignment with said holes.

3. The method of claim 2 wherein said terminal pins are forced into said holes through said apertured plate.

4. A terminal pin mounting method comprising the steps of supporting a plurality of terminal pins over an apertured plate, vibrating the apertured plate in order to position one terminal pin in each plate aperture, positioning a circuit member beneath the apertured plate with a hole in the circuit member aligned with each aperture, and forcing the terminal pins through the apertures and into the circuit member holes to various depths, said forcing step including positioning a stepped platen toward the apertured plate to contact the pins in the apertures and moving the platen toward the apertured plate to force the pins into the circuit member.

5. The method of claim 4 wherein the step of positioning said circuit member is carried out prior to the vibrating step.

6. The method of claim 4 further comprising the step of underlaying the circuit member with a backing plate having a hole aligned with each circuit member hole before the forcing step.

7. The method of claim 4 further comprising positioning a feeding plate having a plurality of holes each sized to slidingly receive a group of terminal pins above the apertured plate, lifting the feeding plate from the apertured plate after said vibrating step, and removing the remaining terminal pins of each group from the surface of the feeding plate before said forcing step while leaving a single terminal pin in each aperture plate hole.

8. Apparatus for mounting terminal pins in holes in a circuit member having first and second major opposed surfaces comprising: an apertured plate assembly for aligning one of said terminal pins with each of said holes, and a stepped platen having a working surface for forcing said pins into said circuit member from said first major opposed surface, said working surface having a recessed portion positioned in alignment with at least one of said terminal pins, said platen being adapted to force said terminal pins through said circuit member such that the major portion of any pin aligned with said recessed portion extends outwardly from said first major opposed surface and the major portion of the other ones of said pins extends from said second major opposed surface.

9. The apparatus of claim 8 wherein said plate assembly comprises a feeding plate having a plurality of holes defined therein, each of said holes being sized to slidingly receive a plurality of terminal pins, and a loading plate positioned in alignment with said feeding plate, said loading plate having a plurality of apertures defined therein, each of said apertures being sized to slidingly receive a single one of said pins and aligned with one of said holes in said circuit member.

10. The apparatus of claim 9 further including a backing plate adapted to be positioned against said second major opposed surface of said circuit member, said backing plate having a plurality of holes defined therein for slidingly receiving the terminal pins forced through said circuit member.

11. The apparatus of claim 10 wherein the loading plate is interposed between said circuit member and said platen during the forcing of said pins into said circuit member.

12. The apparatus of claim 8 wherein said recessed portion is substantially rectangular for receiving an array of terminal pins.

13. The apparatus of claim 8 wherein said recessed portion is elongated for receiving a row of terminal pins.

14. The apparatus of claim 8 wherein said recessed portion is substantially circular for receiving a single one of said pins.

* * * * *